(12) United States Patent
Atoh (10) Patent No.: US 6,431,948 B1
(45) Date of Patent: Aug. 13, 2002

(54) WAFER CLEANING APPARATUS (75) Inventor: Kohji Atoh, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/585,613

(22) Filed: Jun. 2, 2000

(30) Foreign Application Priority Data

Jun. 2, 1999 (JP) .......................................... 11-155189

(51) Int. Cl.$^7$ ............................................... B24B 7/22
(52) U.S. Cl. .............................. 451/5; 451/67; 451/41; 451/54; 451/287; 134/902
(58) Field of Search ................ 451/5, 67, 41, 451/54, 287, 288, 290; 134/902, 18, 32

(56) References Cited

U.S. PATENT DOCUMENTS

| | | | |
|---|---|---|---|
| 5,273,060 A | * 12/1993 | Hill, III et al. | 134/57 |
| 5,518,542 A | * 5/1996 | Matsukawa et al. | 118/52 |
| 5,827,110 A | * 10/1998 | Yajima et al. | 451/5 |
| 5,885,134 A | * 3/1999 | Shibata et al. | 451/5 |
| 5,964,954 A | * 10/1999 | Matsukawa et al. | 134/6 |
| 6,074,276 A | * 6/2000 | Shibata et al. | 451/8 |

FOREIGN PATENT DOCUMENTS

| | | | | |
|---|---|---|---|---|
| JP | 410044040 A | * | 2/1998 | ........... B24B/57/00 |
| JP | 11-90355 | | 6/1999 | |

OTHER PUBLICATIONS

Computer Translation of Tatsuhito et al. (JP 11–90355).

* cited by examiner

*Primary Examiner*—M Rachuba
(74) *Attorney, Agent, or Firm*—Wenderoth, Lind & Ponack, L.L.P.

(57) ABSTRACT

A wafer cleaning apparatus is capable of preventing a failure affecting the overall apparatus, even if a sealing property of a sealing member is damaged. A cleaning chamber for cleaning a wafer by a cleaning device while rotating the wafer is separated by a partition member from a power section, e.g. an air cylinder, for driving each member in the cleaning chamber. Power of the power section is transmitted to the cleaning chamber by extending a power transmission member, e.g. a connecting rod, connected to the power section into the cleaning chamber through an opening formed on the partition member. A dam 31 is provided in the opening of the partition member so as to surround the power transmission member and to protrude into the cleaning chamber.

8 Claims, 4 Drawing Sheets

WAFER CLEANING APPARATUS

BACKGROUND OF THE INVENTION

1. Field of the Invention

The present invention relates generally to a wafer cleaning apparatus used in a semiconductor manufacturing process, and more specifically to a wafer cleaning apparatus having features in sealing and box structure in the cleaning apparatus.

2. Related Arts

Recently, as integrated density of semiconductor devices is increased, wiring in circuits is made to be more microstructured and also a distance between adjacent wires of wiring (hereafter referred to as wiring distance) is become narrower. Especially in a photo-lithography with a wiring distance less than 0.5 micrometer, a shorter focal depth of a stepper requires an imaging surface to be of fine flatness. In addition, since a trouble such as short-circuit of wiring may occur when there is a particle having a size longer than that of the wiring distance on a wafer, it is important in a wafer processing to keep a clean environment as well as to accomplish a required flatness. These requirements are also applied to a processing treatment of various wafers such as a glass substrate used for masking, a liquid crystal panel or the like. A cleaning apparatus has been used to clean the wafer, but a conventional wafer cleaning apparatus has problems described below.

Each component disposed in a cleaning chamber of the wafer cleaning apparatus for cleaning the wafer is generally made of material with superior corrosion resistance against cleaning chemical liquid or the like, such as synthetic resin or ceramics.

In a power section including a driving motor, an air cylinder or the like for driving said wafer or cleaning mechanism, however, some components are required to be made of metal due to a machining precision or a strength required therefor. In some cases, a surface treatment such as resin coating is applied to such metal components, but, in case of a sliding or a fitting portion, it is sometimes difficult to apply the surface treatment because of high precision required therefor. Therefore, it is important to separate the cleaning chamber from the power section by a reliable sealing method in order to prevent the metal portions from being exposed to an inside of the cleaning chamber so as for the power section to be protected from being brought into contact with the cleaning chemical liquid.

As for the sealing method, a gasket or an O-ring may be employed to seal a stationary portion. In an operative portion accompanied with a relative movement between components, a sealing member made of flexible resin material may be employed to shut off a leakage.

In the sealing member made of resin material, however, there is a possibility of the sealing property being damaged by cracking formed thereon due to an aging or a stress applied thereto by repeated motions.

In the sealing portions employing the gasket or the O-ring, there is also a considerable possibility that these components might be cut or nicked during repeated disassembling and assembling in maintenance services or the like resulting in a certain level of damage of the sealing property possibly causing an effusion of the cleaning liquid.

SUMMARY OF THE INVENTION

In view of the above-mentioned situation, the present invention has been made, and a primary object thereof is to provide a wafer cleaning apparatus capable of preventing a failure affecting all over the apparatus even if the sealing property of the sealing member is damaged.

In order to solve the problem described above, the present invention provides a wafer cleaning apparatus in which a cleaning chamber for cleaning a wafer by a cleaning means while rotating the wafer is separated by a partition member from a power section driving at least one member in the cleaning chamber, and a power of the power section is transmitted to the cleaning chamber by inserting a first member, i.e. a power transmission mechanism, connected to the power section into the cleaning chamber through an opening formed on the partition member.

The cleaning apparatus comprises further a dam in the opening of the partition member so as to surround the power transmission mechanism and to be protruded into the cleaning chamber so that a liquid entering into the opening is drained through a clearance between the opening and the dam to any place other than the power section, and a flexible sealing member mounted on a portion of the cleaning chamber surrounding the dam so as to seal the opening of the partition member.

Further, the present invention provides a wafer cleaning apparatus in which a sensor for detecting a leakage liquid from the cleaning chamber into a clearance between the sealing member and the dam is provided and thereby a leakage from the cleaning chamber is detected.

Further, the present invention provides a wafer cleaning apparatus in which the cleaning chamber for cleaning the wafer by the cleaning means while rotating the wafer is enclosed by a first box structure and said first box structure is enclosed by a second box structure so as to make a double-box structure.

Further, the present invention provides a wafer cleaning apparatus in which a pressure in the first box structure is kept to be lower than that in the second box structure. In order to accomplish this condition, for example, there is provided an exhaust equipment having a first exhaust hole opening to the first box structure, a second exhaust hole opening to the second box structure, and an exhaust pipe communicating with both of the first and the second exhaust holes so as to exhaust them through one exhaust pipe, wherein an exhaust resistance of the second exhaust hole is controlled to be higher than that of the first exhaust hole.

Further, the present invention provides a polishing apparatus comprising a polishing machine for polishing a wafer surface to be polished by bringing said wafer surface into contact with a polishing surface of a polishing tool and a cleaning machine for cleaning the wafer polished by the polishing machine, said polishing apparatus characterized by employing the wafer cleaning apparatus described above as the cleaning machine.

(Explanation of the Reference Signs)

A: cleaning chamber, A1: partition member, A2: opening, A4: wall, B: inter mediate chamber, C: power chamber, D: arrow, E: exhaust gas, H: waste water, W: wafer, 2: roll sponge for upper surface, 3: roll sponge for lower surface, 4a: air cylinder, 4b: air cylinder, 6a, 6b: motor, 7: controller, 12: roller, 14: motor, 15: air cylinder, 21a, 21b: support arm, 22: shutter plate, 28: sealing member, 29: sealing member, 30: dam, 31: dam, 32: eave, 33: eave, 34a: opening, 36: drain pipe, 37: leaking liquid sensor, 60: connecting member, 67: rotary shaft, 75: exhaust gas pipe, 100: first box structure, 101: dam, 110: polishing machine, 112a, 112b: polishing table, 113a, 113b: top ring, 126: cleaning section, 122: loading/unloading section, 124a, 124b: conveying machine, 130: roller, 138a, 138b: delivery table, 200: second box structure.

DETAILED DESCRIPTION OF THE INVENTION

There will now be described a chemical mechanical polishing apparatus (CMP Apparatus) with a cleaning section composed of a wafer cleaning apparatus according to the present invention.

Figure 4:
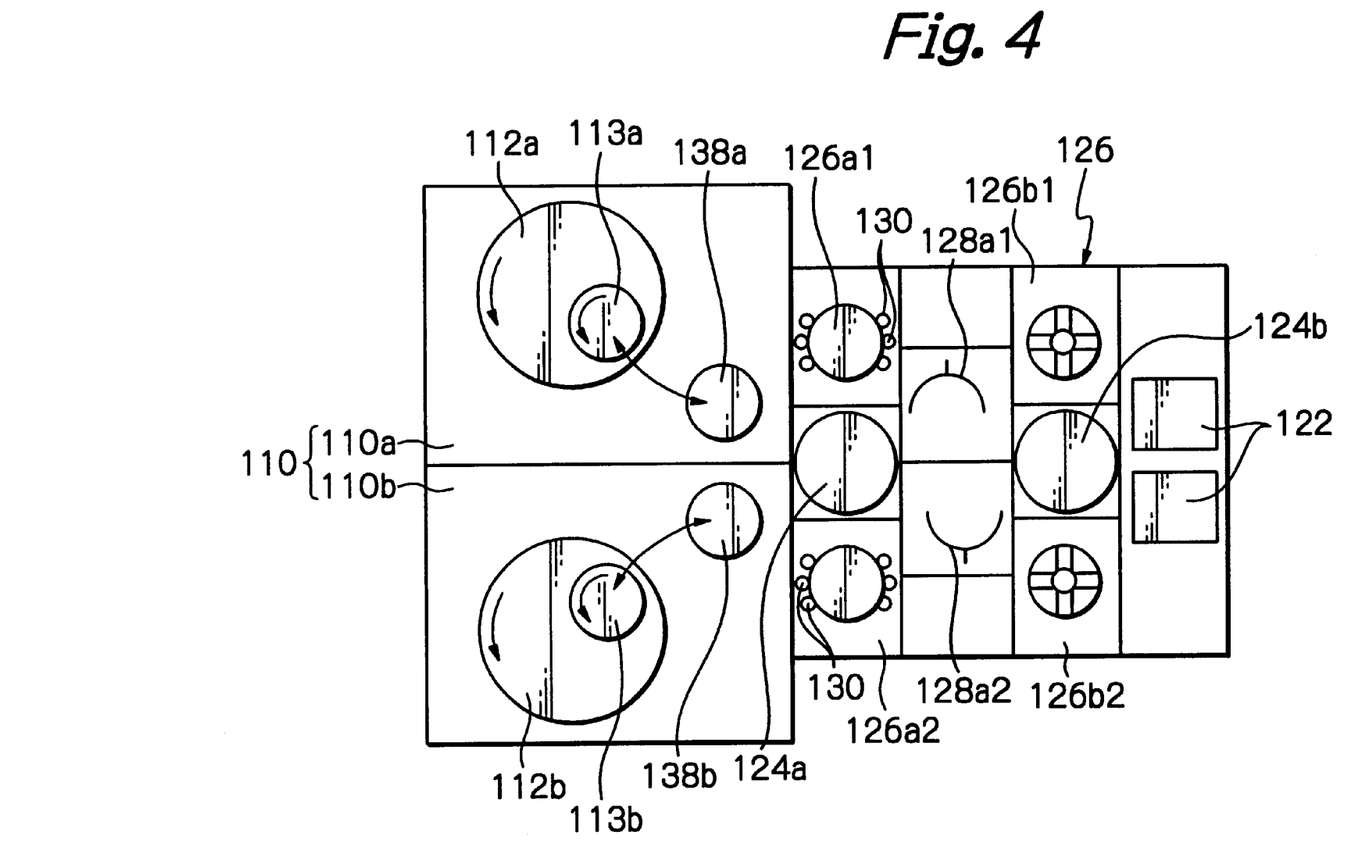
FIG. 4 is an overall schematic plan view illustrating an example of an arrangement of a polishing apparatus to which the present invention is applied.

FIG. 4 is an overall schematic plan view illustrating an example of an arrangement of this kind of polishing apparatus. As shown in FIG. 4, this polishing apparatus includes two polishing machines 110 (110a, 110b), each having the same configuration and being disposed symmetrically in a left and a right sides. A cleaning section 126 includes two primary cleaning machines 126a1, 126a2, two secondary cleaning machines 126b1, 126b2 and two inverting machine 128a1, 128a2, each corresponding to the polishing machines 110a or 110b and being disposed symmetrically in a left and a right sides respectively, and also includes two conveying machines 124a, 124b. Two loading/unloading sections 122, 122 are also disposed symmetrically in left and right sides respectively.

The polishing machines 110a, 110b comprise polishing tables 112a, 112b with cloth (polishing cloth) attached on top surfaces thereof, and top rings 113a, 113b for holding a semiconductor wafer on a lower surface thereof and pushing said wafer onto the polishing tables 112a, 112b to be polished.

In the polishing apparatus having a configuration described above, the wafer is moved from the loading/unloading sections 122 onto the polishing table 112a (or 112b) by using the conveying machines 124a, 124b through a delivery table 138a (or 138b) and by being vacuum-chucked onto the lower surface of the top ring 113a (or 113b). A polishing tool having a polishing surface, such as a polishing pad or a grinding wheel, is attached onto the top surface of the polishing table 112a, 112b. Herein, each of the polishing table 112a (or 112b) and the top ring 113a (or 113b) is rotated and the wafer is pushed onto the polishing surface to be polished while supplying a specified slurry (in case of polishing an insulating layer (oxide film) on a Si wafer, an alkaline aqueous solution including a specified size of polishing powder suspending therein). After being polished, the wafer is returned to the loading/unloading section 122 through a cleaning and drying process.

The primary cleaning machine 126a1, 126a2 is a low-speed rotary type cleaning machine in which a plurality of vertical rollers 130 is disposed surrounding the wafer so that the wafer is held at an outer edge thereof by a groove formed on an upper circumference of the roller 130 and is rotated by a rotation of the roller 130, and a cleaning member comprising a roller type or a pencil type sponge is provided so as to be brought into contact with or to be retracted from each of an upper and a lower sides of the wafer. The secondary cleaning machine 126b1, 126b2 is a high-speed rotary type cleaning machine having four or six arms extending radially from a top end of a rotary shaft for clamping the wafer.

A cleaning process following the polishing process described above is conducted as below. At first, a scrub cleaning is conducted in the primary cleaning machine 126a1 (or 126a2), in which the wafer is rotated and the cleaning member is rubbed against both sides of the wafer while supplying the cleaning liquid onto both sides thereof.

Then, in the secondary cleaning machine 126b1 (or 126b2), the wafer is cleaned and, after that, is rotated in high-speed to conduct a drying process. After having finished the cleaning/drying process, the wafer is returned to the loading/unloading section 122 by a clean hand of the conveying machine 124b.

In this polishing apparatus, two operation methods may be employed, one being a parallel operation method in which each wafer is individually polished in either of two polishing machines 110a, 110b, and the other being a serial operation method in which each wafer is conveyed through both polishing machines 110a, 110b in order for the separate processes to be applied thereto respectively.

In the parallel operation method, each of a normal polishing using abrasives and a final or water polishing using only water without abrasive is conducted alternately in each of the polishing machines 110a, 110b, placing a time lag therebetween so that the conveying machines 124a, 124b may efficiently convey the wafers. Since this polishing apparatus comprises two polishing machines 110a, 110b, two primary cleaning machines 126a1, 126a2, and two secondary cleaning machines 126b1, 126b2, two wafer processing line may be constructed, one being a first wafer processing line in which are conducted the polishing process by the polishing machine 110a, the primary cleaning process by the primary cleaning machine 126a1, and the secondary cleaning process by the secondary cleaning machine 126b, the other being a second wafer processing line in which are conducted the polishing process by the polishing machine 110b, the primary cleaning process by the primary cleaning machine 126a2, and the secondary cleaning process by the secondary cleaning machine 126b2, and therefore two wafer processing lines may be independently operated parallel with each other without any intersection of wafer conveying lines to improve an operation efficiency.

In this polishing apparatus, there are also two methods in the parallel operation method. In a first method, each wafer taken out of one cassette of the loading/unloading section 122 is distributed in turn to either of the polishing machines 110a, 110b. In this method, a processing time for one cassette may be decreased by half. In the second method, one cassette is exclusively used for one wafer processing line and the other cassette is exclusively used for the other wafer processing line. At that time, the wafer of the one line may be identical with or different from that of the other line. In addition, a continuous processing will be made possible when four cassettes are mountable.

In the serial operation method, the normal polishing is applied to the wafer in one polishing machine 110a and then the wafer is conveyed to the other polishing machine 110b to apply the water polishing thereto. If there is no fear of contamination on the polishing machine, the wafer may be directly conveyed from the one polishing machine 110a to the other polishing machine 110b with the conveying machine 124a. When there is a fear of contamination, after the normal polishing having been applied to the wafer by the one polishing machine 110a, the wafer is conveyed by the conveying machine 124a to the primary cleaning machine 126a1 to be cleaned, and then the wafer is conveyed to the other polishing machine 110b to apply the water polishing thereto. Further, in the primary cleaning machine 126a1, the wafer may be cleaned while adding a preferable chemical liquid in response to the kind of slurry used in the one polishing machine 110a. In this serial operation method, since the normal polishing and the water polishing are conducted on different polishing tables 112a, 112b respectively, the polishing liquid or pure water on respective polishing tables are not required to be switched every time with each other, and accordingly a loss time in the process and an increase of consumed volume of polishing liquid and the pure water may not occur.

Figure 1:
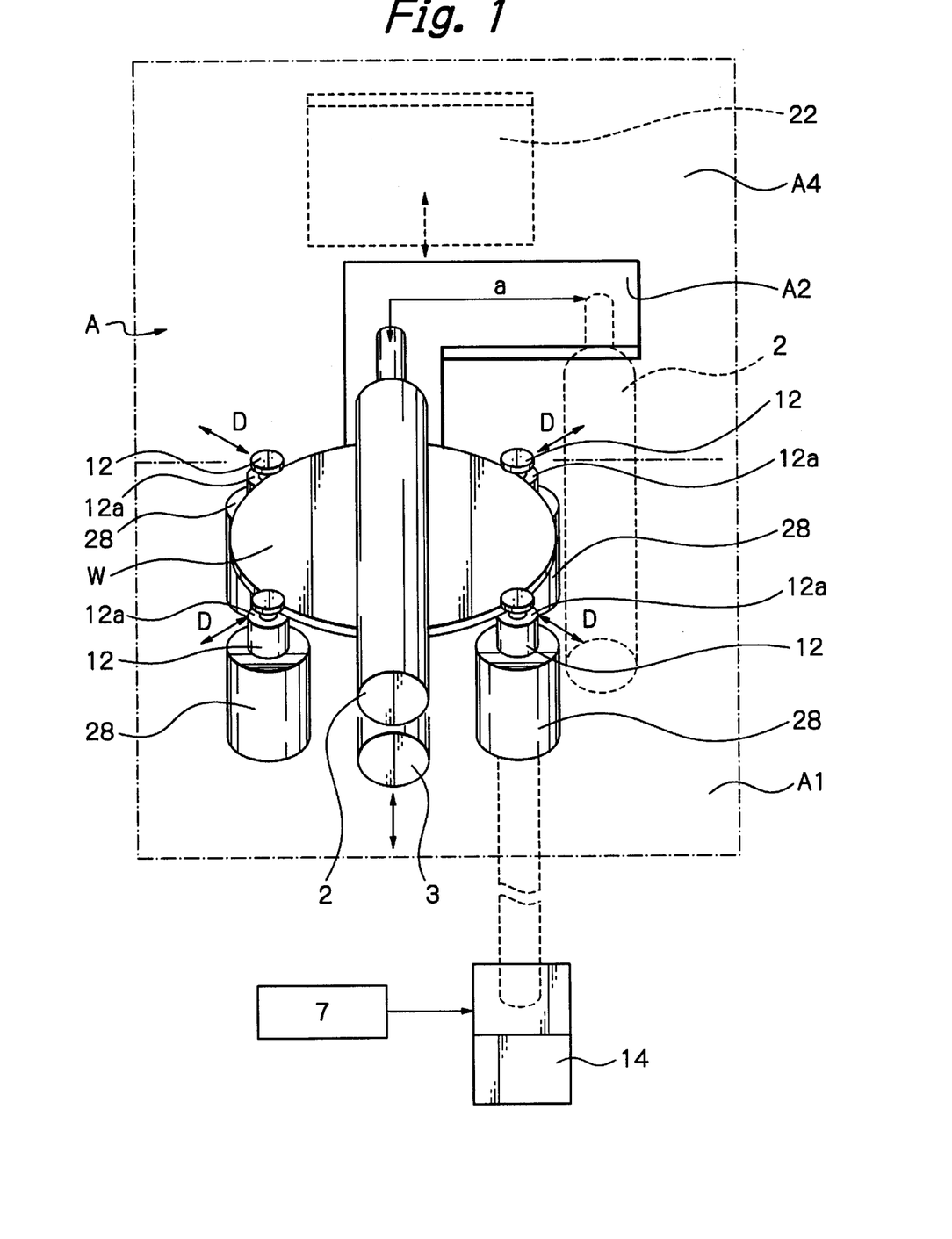
FIG. 1 is an explanatory perspective view of a wafer cleaning apparatus according to the present invention, illustrating a basic operation thereof.

The wafer cleaning apparatus of the present invention uses the primary cleaning machines 126a1, 126a2. FIG. 1 is an explanatory perspective view of a wafer cleaning apparatus according to the present invention, illustrating a basic operation thereof. That is, in this wafer cleaning apparatus, the wafer W is held at the circumference thereof by grooves 12a formed on four (three or more are acceptable) rollers 12, and at least one of the rollers 12 is connected to a motor 14 at a lower side thereof. The motor 14 is rotatable in response to a signal generated by a controller 7. Each roller 12 is protruded downward through a partition member A1, which is a bottom board of the cleaning chamber A, and an intersection portion is sealed by a sealing member 28 so that the cleaning liquid may not leak into a space under the partition member A1. As shown by arrows D in FIG. 1, each roller 12 is designed to be movable in parallel and radial directions within a horizontal plane of the wafer W, so that the wafer may be held or released.

On each of upper and lower surfaces of the wafer W, a roll sponge (cleaning member) 2 for the upper surface and another roll sponge (cleaning member) 3 for the lower surface are provided respectively. Driving motors 6a and 6b (not shown) are installed in an outside of the cleaning chamber A and each of them is connected to each of the roll sponges 2, 3 through a side wall A4 respectively.

A L-shaped opening A2 is provided on the side wall A4 so that the roll sponge 2 for the upper surface may be moved along a L-shaped arrow "a" to a retracted position shown by a dotted line. A shutter plate 22 is provided on an outside of the side wall A4 so as to be movable upward or downward to expose or close the opening A2.

The roll sponge 3 for the lower surface is designed to be movable upward or downward by an air cylinder 4b connected thereto through the partition member A1, though not shown in FIG. 1.

The wafer W is held at its periphery by the groove 12a formed on the roller 12 and is rotated by driving the motor 14, and both of the upper and the lower surfaces of the wafer W are simultaneously cleaned to remove dust therefrom by rubbing the rotating roll sponges 2, 3 against the upper and the lower surfaces of the wafer W respectively while supplying the pure water thereto from a pure water supply means, though not shown. After the cleaning by both roll sponges 2, 3 having been finished, the roll sponge 2 for the upper surface is moved along the arrow "a" (FIG. 1) in the opening A2 to the retracted position shown by the dotted line and then the opening A2 is closed by the shutter 22. On the other hand, the roll sponge 3 for the lower surface is moved downward a little to be kept apart from the wafer W.

Under this condition, a chemical liquid (e.g. hydrofluoric acid (HF) or dilute hydrofluoric acid (DHF)) is supplied to the wafer W from a chemical liquid supply means installed in the cleaning chamber A, though not shown, to remove metal ion therefrom. Finally, the pure water is supplied again from the pure water supply means to replace the chemical liquid on the upper and the lower surfaces of the wafer W with the pure water, and thereby the cleaning process in the cleaning chamber A is completed. Then, each of the rollers 12 is moved along the arrow D to release the wafer W from its held condition and the wafer W is taken out of the cleaning chamber A to move to the next process.

Figure 2:
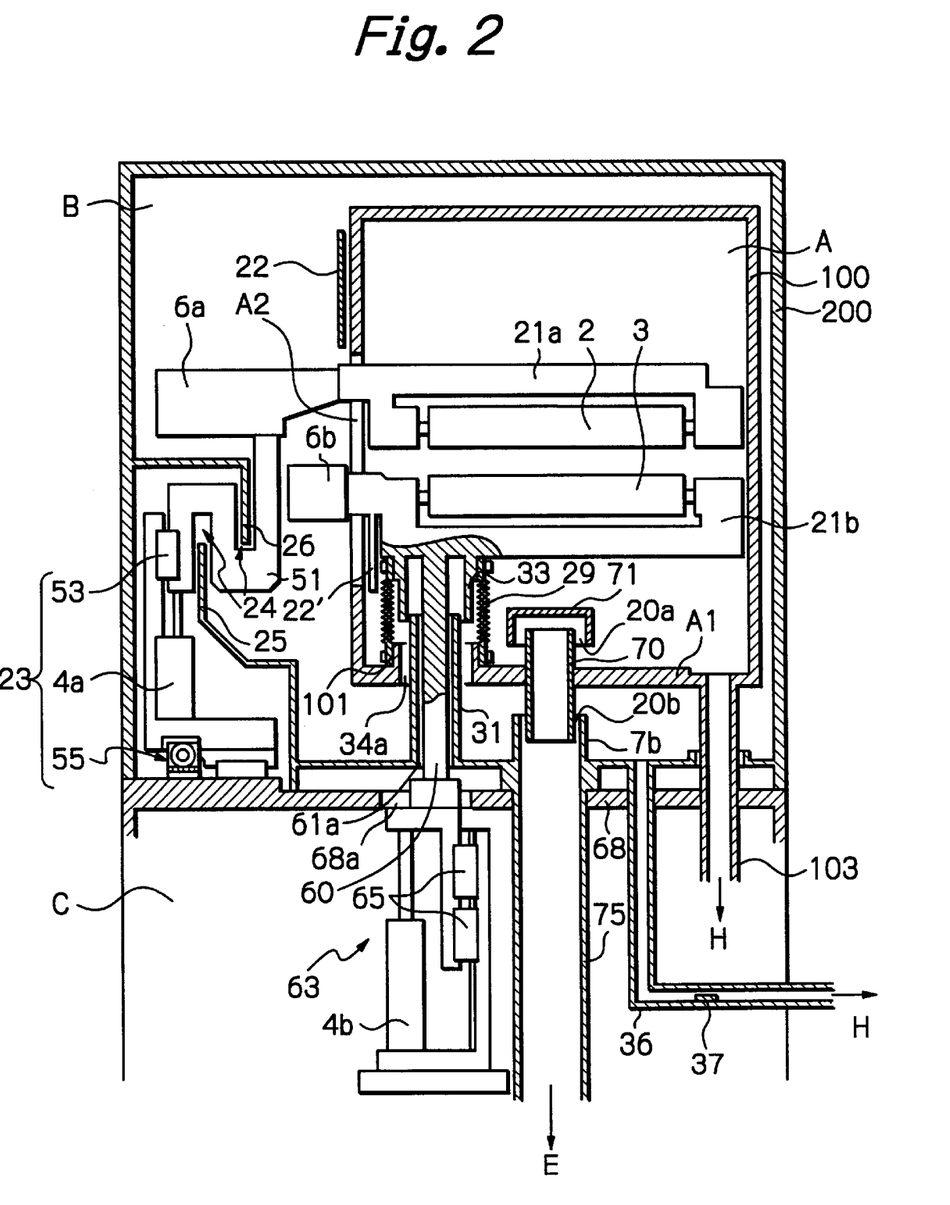
FIG. 2 is a schematic longitudinal sectional view illustrating a detailed concrete configuration of the wafer cleaning apparatus according to the present invention.
Figure 3:
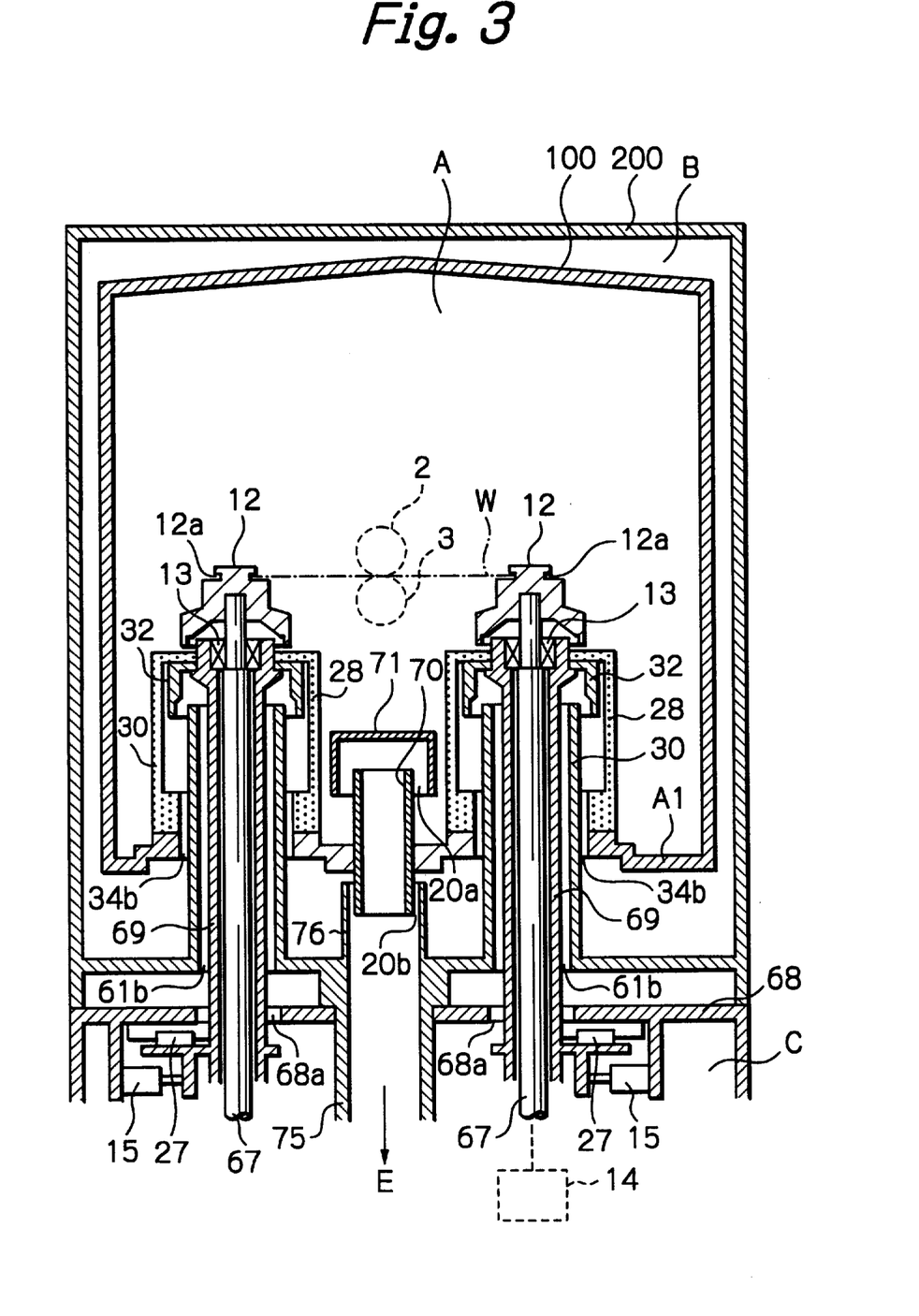
FIG. 3 is another schematic longitudinal sectional view illustrating a detailed concrete configuration of the wafer cleaning apparatus according to the present invention.

FIGS. 2 and 3 are schematic longitudinal sectional views illustrating a detailed concrete configuration of the wafer cleaning apparatus according to the present invention, and respective views show sections intersecting at about right angle with each other. In the wafer cleaning apparatus shown in FIGS. 2, 3, the cleaning chamber A is formed in a first box structure 100, which in turn is enclosed by a second structure 200 to form an intermediate chamber B within a space of the second box structure 200, and a power chamber C is provided under the second box structure 200. Within the cleaning chamber A, the cleaning liquid including a corrosive chemical such as HF is allowed to be dispersed in order to clean the wafer W.

The upper roll sponge 2 and the lower roll sponge 3 disposed in the cleaning chamber A are respectively supported by a support arm 21a or 21b, and are connected to a motor 6a or 6b installed in an outside of the first box structure 100 through the opening A2 formed thereon (see FIG. 1). A shutter 22 is provided on an upper side of the opening A2 to close the opening A2 while the cleaning chemical being dispersed as described above. In addition, as shown in FIG. 2, a plate type shield member 22' is attached to the support arm 21b to close a lower portion of the opening A2.

The second box structure 200 is disposed surrounding the first box structure 100 and the motors 6a and 6b so as for the cleaning liquid leaking from the first box structure 100 to be prevented from going out. The motor 6a is connected through an arm 51 to an upper roll sponge transfer mechanism 23 disposed in an outside of an opening 24 formed on one side of the second box structure 200. The opening 24 is formed to be directed upward by a dam 25 and an eave 26, so that the cleaning liquid would not leak through the opening 24 to the outside of the box structure 200 even if the cleaning liquid is dispersed from the first box structure 100 into the second box structure 200 due to a possible damage of the apparatus. The opening 24 is formed extending straightly from a near side to a far side on the drawing. The arm 51 is formed into a crank-shape to pass through the opening 24. The arm 51 is made to be movable along a vertical direction since a direct-acting guide 53 is attached to the arm 51 and also an air cylinder 4a is attached to an end of the arm 51, and furthermore, since the air cylinder 4a is mounted on a linear driving mechanism 55, a unit including the air cylinder 4a and the upper roll sponge 2, as a whole, may be linearly driven to the near side or to the far side on the paper. That is, the upper roll sponge transfer mechanism 23 is configured so as for the upper roll sponge 2 to be moved horizontally and vertically by the air cylinder 4a and the linear driving mechanism 55.

On the other hand, a rod type connecting member (power transmission mechanism) 60 attached to the support arm 21b of the lower roll sponge 3 is extended passing through an opening 34a formed on the partition member (bottom board) A1 of the first box structure 100, an opening 61a formed on the second box structure 200 and an opening 68a formed on a base table 68 disposed in an underside of the opening 61a, and is connected to a mechanism 63 for vertically moving the lower roll sponge 3 (hereafter referred to as lower roll sponge moving mechanism 63) installed in the power chamber C disposed in an underside of the opening 68a.

The lower roll sponge moving mechanism 63 is configured so as for the lower roll sponge 3 to be moved vertically in order to be brought into contact with or to be apart from the wafer W by connecting an air cylinder 4b to the connecting member 60. Reference numeral 65 designates a direct-acting guide.

A dam 31 is protruded into the opening 34a of the first box structure 100, surrounding the connecting member 60. The dam 31 is configured into tube-shape protruding upward from a periphery of the opening 61a of the second box structure 200. On the other hand, a tube-shaped eave 33 is protruded downward from the support arm 21b, surrounding the connecting member 60 and extending to a lower level than a top end of the dam 31. The eave 33 is designed such that a lower end thereof is in a lower level than a top end of the dam 31 even when the support arm 21b is in a most elevated position (i.e. the position shown in FIG. 2). In addition, a tube-shaped dam 101 is protruded upward from a periphery of the opening 34a.

In a portion of the cleaning chamber A, surrounding the dam 31, a flexible sealing member 29 is provided in order to seal the opening 34a. In concrete, the bellows-type sealing member 29 is tightly attached to the circumferences of the eave 33 and the dam 101 to make a sealing. The sealing member 29 is made of rubber or synthetic resin being flexible and corrosion resistive against cleaning chemical liquid or the like.

Referring to FIG. 3, the roller 12 has the groove 12a for holding the periphery of the wafer W, and a rotary shaft (power transmission mechanism) 67 of the roller 12 is extended through an opening 34b formed on the partition member (bottom board) A1 of the first box structure 100, an opening 61b formed on the second box structure 200, and an opening 68a formed on the base table 68, into the power chamber C. At least one of the rotary shafts 67 is connected to the motor 14. A tube 69 is provided surrounding the rotary shaft 67 which is rotatably supported by a bearing 13 attached to a top of the tube 69.

An air cylinder 15 and a direct-acting guide 27 are provided on a lower side of the base table 68 to move each of the tubes 69 along the arrows D shown in FIG. 1.

A dam 30 surrounding the tube 69 is protruded into the opening 34b of the first box structure 100. The dam 30 is configured into tube-shape protruding upward from a periphery of the opening 61b of the second box structure 200. Above the tube 69, a tube-shaped eave 32 is protruded downward surrounding the tube 69 and extending to a lower level than a top end of the dam 30. The eave 32 is designed to have a large inside diameter so as for an inner surface thereof not to come in contact with the dam 30 even when the eave 32 is moved together with the horizontal movement of the tube 69.

In a portion of the cleaning chamber A, surrounding the dam 30, a flexible sealing member 28 is provided in order to seal the opening 34b. In concrete, the sealing member 28 is tightly attached to upper surfaces of the eave 32 and of a periphery of the opening 34b to form a seal. The sealing member 28 is made of rubber or synthetic resin being flexible and corrosion resistive against cleaning chemical liquid or the like, and is formed into approximately tube-shape.

An exhaust pipe 70 is provided in a central portion of the first box structure 100 passing vertically through the partition member A1 thereof. A cover 71 for covering a top of the exhaust pipe 70 is provided to contract an opening of a first exhaust hole 20a in the cleaning chamber A. On the other hand, a dam 76 is protruded upward from the second box structure 200, and a second exhaust hole 20b is formed by inserting the lower portion of the exhaust pipe 70 into the dam 76 as a clearance therebetween. An exhaust pipe 75 drawn out of the second box structure 200 is connected to an exhaust equipment, though not shown. That is, the first exhaust hole 20a and the second exhaust hole 20b are designed so as for the gases E exhausted through both exhaust holes 20a and 20b to be exhausted through the same exhaust pipe 75.

An opening area of the first exhaust hole 20a is designed to be larger than that of the second exhaust hole 20b so that an exhaust resistance of the second exhaust hole 20b is larger than that of the first exhaust hole 20a. Thereby, a pressure in the first box structure 100 is kept to be higher negative pressure than that in the second box structure 200 when they are exhausted through the exhaust pipe 75.

A conventional drain pipe 103 is attached to the partition member A1 of the first box structure 100, and also a drain pipe 36 is attached to the bottom surface of the second body structure 200. A leakage liquid sensor 37 is attached to a specified position of the drain pipe 36.

Then, an operation of the wafer cleaning apparatus will be described. At first, the air cylinder 15 is actuated to move each of the rollers 12 radially outward (see the arrows D in FIG. 1), the wafer W is inserted from outside to be positioned in the groove 12a, and then the air cylinder 15 is actuated again to move each of the rollers 12 radially inward to clamp the wafer. The motor 14 is then actuated to rotate the wafer W.

Then, the air cylinders 4a, 4b are actuated to bring each of the upper and the lower roll sponges 2, 3 into contact with each of the upper and the lower surfaces of the wafer W. At that time, each of the upper and the lower roll sponges 2, 3 is being rotated by the motors 6a, 6b. Each of the roll sponges 2, 3 is shown in its most elevated position in FIG. 2.

Then, the cleaning liquid such as pure water is supplied to the wafer W to make it clean. After the cleaning having been finished, the air cylinders 4a, 4b are actuated to set each roll sponge 2, 3 apart from the upper or the lower surface of the wafer W, and further, the upper roll sponge 2 is moved by the upper roll sponge transfer mechanism 23 to its retracted position shown by the dotted line in FIG. 1. Then, the shutter 22 is closed to cover the opening A2, the chemical liquid is supplied to the rotating wafer W driven by the roller 12 in order to remove the metal ion, and finally, the pure water is supplied again to replace the chemical liquid on the upper and the lower surfaces of the wafer W with the pure water. Then, each of the rollers 12 is moved radially outward by the air cylinder 15 to release the wafer W from its held condition and the wafer W is taken out of the cleaning chamber A to move to the next process.

While the wafer W is being cleaned by the cleaning liquid such as the pure water or the chemical liquid, the cleaning liquid does not leak out though the openings 34a, 34b since these openings 34a, 34b are sealed by the sealing members 28, 29. Even if the sealing member 28 or 29 is broken by aging or the like and the cleaning liquid leaks out through the opening 34a or 34b, the cleaning liquid leaking through the openings is stored within the intermediate chamber B since there are dams 30, 31, and therefore, there is no fear of leaking into the power chamber C disposed under the second box structure 200. Especially in this embodiment, since the eaves 32, 33 are provided so as to cover the dams 30, 31 (the eave is extended to the lower level than the top end of the dam), the cleaning liquid is prevented from flowing into inside the dams 30, 31 from above, and thereby there is no fear of leaking into the power chamber C.

On the other hand, since the leakage liquid stored in the intermediate chamber B is drained through the drain pipe 36 of the second box structure 200 and then is detected by the leakage liquid sensor 37, the breakage of the sealing members 28, 29 can be detected without any danger and thereby the liquid leakage accident can be prevented and also possible negative effects on the human body as well as on the equipment can be minimized.

Corrosive gases volatilized from the cleaning liquid, such as HF or DHF, are exhausted through the exhaust hole 20a into the exhaust pipe 75 so as not to fill the cleaning chamber A. Gases volatilized from the leakage liquid and stored in the intermediate chamber B are also exhausted through the exhaust hole 20b into the exhaust pipe 75 so as not to fill the intermediate chamber B and not to flow out of the second box structure 200. At that time, since the exhaust resistance of the exhaust hole 20a is made smaller than that of the exhaust hole 20b as described above, the pressure in the cleaning chamber A is kept to be in more negative pressure than that in the intermediate chamber B disposed outside the cleaning chamber A. Therefore, the corrosive gas can be prevented from flowing out of the cleaning chamber A in the first box structure 100.

Although the embodiments of the present invention have been described in detail, the present invention does not limited to these embodiments, and it is to be appreciated that various changes and modification may be made within the scope of the attached claims and the technical concept described throughout the specification. For example, there are various types of systems in the driving mechanism for rotating the wafer or the cleaning means for cleaning the wafer, and any system may be employed so far as it may clean the wafer by the cleaning means while rotating the wafer. Further, various modifications may be applied to the mechanism for driving or actuating the wafer or the cleaning means, and it may be of any type so far as it is a power section capable of driving or actuating the members within the cleaning chamber. Still further, various modifications may be applied also to the sealing member, and it may be of any structure or material so far as it is flexible sealing member suitable for sealing the opening formed on the partition member. Furthermore, various changes may be made on the shape or structure of the dam and the eave. Though, in the above embodiment, the leakage liquid sensor 37 is installed in the specified position on the drain pipe 36, the leakage liquid sensor may be installed in any place so far as it is suitable for detecting the leakage liquid leaking through the clearance between the dam and the sealing member.

Effect of the Invention

As having been described in detail in the above, the present invention provides many advantageous effects as follows:

(1) The dam is provided in the opening of the partition member so that the liquid entering into the opening may be drained into any places other than the power section and the sealing member is provided to seal the opening, therefore, the cleaning liquid is prevented from leaking into the power section even if the sealing property of the sealing member is damaged resulting in a leakage of the cleaning liquid, and thereby the failure affecting overall apparatus may be prevented. To add to that, the possible negative effect on the human body may be minimized.

(2) The leakage liquid leaking through the clearance between the dam and the sealing member is detected by the sensor, therefore, the breakage of the sealing member can be detected immediately, and thereby the possible failure of the apparatus can be promptly and surely prevented.

(3) The double box structure is made by enclosing the cleaning chamber by the first box structure and further enclosing the first box structure by the second box structure, therefore, the cleaning liquid can be kept within the second box structure even if the cleaning liquid leaks out of the first box structure, and thereby the further leakage of the cleaning liquid can be prevented.

(4) The pressure in the first box structure is kept to be in more negative pressure than that in the second box structure by setting the exhaust resistance of the second exhaust hole to be larger than that of the first exhaust hole, therefore, the corrosive gases volatilized from the cleaning liquid in the first box structure can be prevented from flowing into the second box structure, and at the same time, since the gas in the second box structure is exhausted, the gas does not fill the second box structure.

What is claimed is:

1. A wafer cleaning apparatus comprising:

a cleaning chamber for cleaning a wafer;

a power section for driving at least one member in said cleaning chamber;

a partition member separating said cleaning chamber from said power section, said partition member having an opening;

a power transmission member connected to said power section, said power transmission member extending into said cleaning chamber through the opening formed on said partition member;

a dam in the opening on said partition member and surrounding said power transmission member, said dam protruding into said cleaning chamber so that liquid near the opening on said partition member is drained through a clearance between the opening and said dam to any place other than said power section; and a sealing member surrounding said dam so as to seal the opening on said partition member.

2. A wafer cleaning apparatus according to claim 1, further comprising a sensor for detecting a leakage liquid leaking from said cleaning chamber into a clearance between said sealing member and said dam.

3. A polishing apparatus comprising:

a polishing machine having a polishing tool with a polishing surface for polishing a surface of a wafer by bringing the surface of the wafer into contact with said polishing surface of said polishing tool; and a cleaning machine for cleaning the wafer polished by said polishing machine, said cleaning machine comprising:

a cleaning chamber for cleaning a wafer;

a power section for driving at least one chamber in said cleaning chamber;

a partition member separating said cleaning chamber from said power section, said partition member having an opening;

a power transmission member connected to said power section, said power transmission member extending into said cleaning chamber through the opening formed on said partition member;

a dam in the opening on said partition member and surrounding said power transmission member, said dam protruding into said cleaning chamber so that liquid near the opening on said partition member is drained through a clearance between the opening and said dam to any place other than said power section; and a sealing member surrounding said dam so as to seal the opening on said partition member.

4. A wafer cleaning apparatus comprising:

a cleaning chamber for cleaning a wafer with a cleaning device;

a power section;

a partition member having an opening, said partition member separating said cleaning chamber from said power section;

a first member connected to said power section, said first member extending into said cleaning chamber through the opening formed on said partition member;

a dam in the opening of said partition member and surrounding said first member, said dam protruding into said cleaning chamber so that liquid near the opening is drained through a clearance between the opening and said dam to any place other than said power section; and a sealing member on a portion of said cleaning chamber surrounding said dam, said sealing member sealing the opening on said partition member.

5. A wafer cleaning apparatus according to claim 4, wherein said sealing member is a flexible sealing member, and said first member is a power transmission member operable to transmit power from said power section to said cleaning chamber.

6. A polishing apparatus comprising:

a polishing machine having a polishing tool with a polishing surface for polishing a surface of a wafer by bringing the surface of the wafer into contact with said polishing surface of said polishing tool; and a cleaning machine for cleaning the wafer polished by said polishing machine, said cleaning machine comprising:

a cleaning chamber for cleaning a wafer;

a power section for driving at least one member in said cleaning chamber;

a partition member separating said cleaning member from said power section, said partition member having an opening;

a power transmission member connected to said power section, said power transmission member extending into said cleaning chamber through the opening formed on said partition member;

a dam in the opening on said partition member and surrounding said power transmission member, said dam protruding into said cleaning chamber so that liquid near the opening on said partition member is drained through a clearance between the opening and said dam to any place other than said power section;

a sealing member surrounding said dam so as to seal the opening on said partition member; and a sensor for detecting a leakage liquid leaking from said cleaning chamber into a clearance between said sealing member and said dam.

7. A wafer cleaning apparatus according to claim 1, wherein the liquid is drained through the clearance to an exterior of said cleaning chamber.

8. A wafer cleaning apparatus according to claim 4, wherein the liquid is drained through the clearance to an exterior of said cleaning chamber.

\* \* \* \* \*